(12) United States Patent
Bergmann et al.

(10) Patent No.: US 9,437,785 B2
(45) Date of Patent: Sep. 6, 2016

(54) LIGHT EMITTING DIODES INCLUDING INTEGRATED BACKSIDE REFLECTOR AND DIE ATTACH

(75) Inventors: Michael John Bergmann, Chapel Hill, NC (US); Kevin Ward Haberern, Cary, NC (US); Bradley E. Williams, Cary, NC (US); Winston T. Parker, Cary, NC (US); Arthur Fong-Yuen Pun, Raleigh, NC (US); Doowon Suh, Cary, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 1411 days.

(21) Appl. No.: 12/538,602

(22) Filed: Aug. 10, 2009

(65) Prior Publication Data

US 2011/0031502 A1    Feb. 10, 2011

(51) Int. Cl.
  *H01L 33/00*    (2010.01)
  *H01L 33/46*    (2010.01)
  *H01L 33/20*    (2010.01)

(52) U.S. Cl.
  CPC ............. *H01L 33/46* (2013.01); *H01L 33/007* (2013.01); *H01L 33/20* (2013.01); *H01L 2224/73265* (2013.01)

(58) Field of Classification Search
  USPC .................................. 257/E33.055, E33.068
  See application file for complete search history.

(56) References Cited

U.S. PATENT DOCUMENTS

| 6,078,064 | A  | 6/2000  | Ming-Jiunn et al. |
| 6,740,906 | B2 | 5/2004  | Slater, Jr. et al. |
| 6,791,119 | B2 | 9/2004  | Slater, Jr. et al. |
| 6,794,684 | B2 | 9/2004  | Slater, Jr. et al. |
| 6,853,010 | B2 | 2/2005  | Slater, Jr. et al. |
| 6,869,812 | B1 | 3/2005  | Liu |
| 6,888,167 | B2 | 5/2005  | Slater, Jr. et al. |
| 7,067,340 | B1 | 6/2006  | Tsai et al. |
| 7,087,931 | B2 | 8/2006  | Wu et al. |
| 7,132,695 | B2 | 11/2006 | Ou et al. |
| 7,183,586 | B2 | 2/2007  | Ichihara et al. |

(Continued)

FOREIGN PATENT DOCUMENTS

| CN | 1633706 A | 6/2005 |
| CN | 1682384 A | 10/2005 |

(Continued)

OTHER PUBLICATIONS

International Preliminary Report on Patentability Corresponding to International Application No. PCT/US2010/043615; Date of Mailing: Jul. 26, 2011; 19 pages.

(Continued)

*Primary Examiner* — Daniel Whalen
(74) *Attorney, Agent, or Firm* — Myers Bigel & Sibley, P.A.

(57) ABSTRACT

Light emitting diodes include a silicon carbide substrate having first and second opposing faces, a diode region on the first face, anode and cathode contacts on the diode region opposite the silicon carbide substrate and a hybrid reflector on the silicon carbide substrate opposite the diode region. The hybrid reflector includes a transparent layer having an index of refraction that is lower than the silicon carbide substrate, and a reflective layer on the transparent layer, opposite the substrate. A die attach layer may be provided on the hybrid reflector, opposite the silicon carbide substrate. A barrier layer may be provided between the hybrid reflector and the die attach layer.

23 Claims, 6 Drawing Sheets

(56) References Cited

U.S. PATENT DOCUMENTS

| | | | |
|---|---|---|---|
| 7,211,833 B2 | 5/2007 | Slater, Jr. et al. | |
| 7,274,040 B2 | 9/2007 | Sun | |
| 7,622,746 B1 | 11/2009 | Lester et al. | |
| 2002/0123164 A1* | 9/2002 | Slater, Jr. | H01L 33/20 438/39 |
| 2003/0010975 A1* | 1/2003 | Gibb et al. | 257/40 |
| 2003/0085851 A1 | 5/2003 | Horng et al. | |
| 2003/0168663 A1* | 9/2003 | Slater, Jr. | H01L 21/0485 257/77 |
| 2004/0056260 A1* | 3/2004 | Slater, Jr. | H01L 33/505 257/79 |
| 2004/0169185 A1 | 9/2004 | Liu | |
| 2005/0067636 A1 | 3/2005 | Amoh et al. | |
| 2006/0049417 A1 | 3/2006 | Li et al. | |
| 2006/0145170 A1* | 7/2006 | Cho | 257/95 |
| 2006/0255358 A1 | 11/2006 | Shum | |
| 2007/0141806 A1 | 6/2007 | Uemura et al. | |
| 2007/0145380 A1 | 6/2007 | Shum et al. | |
| 2008/0035949 A1 | 2/2008 | Fudeta et al. | |
| 2008/0283854 A1 | 11/2008 | Iza et al. | |
| 2010/0140636 A1* | 6/2010 | Donofrio et al. | 257/98 |
| 2011/0018013 A1 | 1/2011 | Margalith et al. | |

FOREIGN PATENT DOCUMENTS

| | | |
|---|---|---|
| EP | 1 263 058 A2 | 12/2002 |
| JP | 2007-173534 A | 5/2007 |
| JP | 2008-192825 A | 8/2008 |
| JP | 2009-21349 | 1/2009 |
| JP | 2010-199335 A | 9/2010 |
| WO | WO 2007/073001 A1 | 6/2007 |
| WO | WO 2007073001 A1 * | 6/2007 |
| WO | WO 2007/136391 A1 | 11/2007 |
| WO | WO 2007/136392 A1 | 11/2007 |
| WO | WO 2010/077571 A1 | 7/2010 |

OTHER PUBLICATIONS

Cree, Inc., Data Sheet CPR3DK Rev. B "TR260™ LEDs CxxxTR260-Sxx00", 2007-2009, 6 pp.

Cree, Inc., Data Sheet CPR3DQ Rev A, "Cree® TR2432™ LEDs Data Sheet CxxxTR2432-Sxx00" , 2008, 5 pp.

Cree, Inc., Data Sheet CPR3DR Rev A "Cree® TR2436™ LEDs Data Sheet CxxxTR2436-Sxx00" , 2008, 6 pp.

Cree, Inc., Data Sheet CPR3DV Rev—"TR300™LEDs CxxxTR3041-Sxx00", 2008, 5 pp.

Han et al. "The Effect of p—In—GaN layer on ITO based ohmic contacts to p—GaN", International Nano-Optoelectronics Workshop, 2007, i-NOW '07, Jul. 29, 2007-Aug. 11, 2007, pp. 90-91.

Huang et al. "High-Performance GaN-Based Vertical-Injection Light-Emitting Diodes with $TiO_2$—$SiO_2$ Omnidirectional Reflector and n-GaN Roughness" *IEEE Photonics Technology Letters*, 19(8):565-567 (2007).

Jang et al. "Low-resistance and thermally stable indium tin oxide Ohmic contacts on strained $p$—$In_{0.15}Ga_{0.85}N/p$—GaN layer" *Journal of Applied Physics* 101(1):013711-1-013711-4 (2007).

"LED Chips Documentation", downloaded Jul. 13, 2009 from http://www.cree.com/products/led_docs.asp, 2 pp.

Kim Jong et al., "Enhanced light-extraction in GaInN near-ultraviolet light-emitting diode with Al-based omnidirectional reflector having NiZn/Ag microcontacts"; *Applied Physics Letters, American Institute of Physics* 89, 141123 (2006); XP12086109; Published Oct. 5, 2006; 3 pages.

Notification of Transmittal of the International Search Report and the Written Opinion of the International Search Authority, or the Declaration; International Search Report and Written Opinion; Corresponding to International Application No. PCT/US2010/043615; Date of Mailing: Nov. 19, 2010; 19 pages.

Bridgelux, "NLX-5 Blue Power Die 38×38 mil BXCA3838XXX-YY-Z", Nov. 21, 2008, 4 pp.

Nichia Corporation, Specification No. STS-DA1-0181C "Specifications for Nichia Chip Type Warm White LED Model: NS6L083BT", Nov. 20, 2008, 16 pp.

Japanese Office Action Corresponding to Japanese Patent Application No. 2012-524727; Dispatched Date: Jul. 3, 2013; Foreign Text, 5 Pages, English Translation Thereof, 4 Pages.

Second Office Action and English language translation, Chinese Patent Application No. 201080046495.1, Aug. 22, 2014.

First Office Action and English language translation, Chinese Patent Application No. 201080046495.1, Mar. 11, 2014.

* cited by examiner

LIGHT EMITTING DIODES INCLUDING INTEGRATED BACKSIDE REFLECTOR AND DIE ATTACH

BACKGROUND OF THE INVENTION

This invention relates to semiconductor light emitting devices and, more particularly, to semiconductor light emitting diodes (LEDs).

Semiconductor LEDs are widely known solid-state lighting elements that are capable of generating light upon application of voltage thereto. LEDs generally include a diode region including therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials, and/or from organic semiconductor-based materials. Finally, the light radiated by the LED may be in the visible or ultraviolet (UV) regions, and the LED may include wavelength conversion materials such as phosphor.

Some LEDs include top anode and cathode contacts, and are configured for bottom mounting. More specifically, some commercially available LEDs may include a silicon carbide substrate having first and second opposing faces, a diode region on the first face and anode and cathode contacts on the diode region opposite the silicon carbide substrate. An example of these LEDs is the ETC™ family of LEDs manufactured by CREE®. FIG. 1 is a reproduction of a chip diagram from the "*Cree® TR*2432™ *LEDs Data Sheet CxxxTR*2432-*Sxx*00". As shown in the Die Cross-Section of FIG. 1, these LEDs include a relatively thin diode region and a relatively thick silicon carbide substrate that includes oblique sidewalls to enhance light emission through the sidewalls. The Top View of FIG. 1 shows an anode and a cathode bond pad, and the Bottom View illustrates a bottom surface. As noted at Page 1 of this data sheet, "[T]he design may be suited for industry standard sideview packages as it is die attachable with clear epoxy and has two top contacts, consistent with industry standard packaging".

Other commercially available LEDs may include a sapphire substrate having first and second opposing faces, a diode region on the first face, and anode and cathode contacts on the diode region opposite the sapphire substrate. One example of these sapphire-based LEDs is the NLX-5 Blue Power Die marketed by BRIDGELUX® and described in a specification sheet entitled "*NLX*-5 *Blue Power Die* 38×38 *mil BXCA*3838*XXX-YY-Z*", Specification No. BCDS BXCA3838 020509 Rev. 3. These LEDs include a bottom reflector with thin gold. More specifically, the bottom of the device includes a layer of silicon dioxide (about 0.5 μm thick) on the sapphire substrate, followed by alternating layers of titanium dioxide and silicon dioxide on the layer of silicon dioxide, and followed by layers of aluminum, titanium, chromium, platinum and gold that are stacked on the alternating layers of titanium dioxide and silicon dioxide. Another example of an LED that includes a sapphire substrate is the NS6L083BT LED marketed by Nichia Corporation, and described in the "*Specifications for Nichia Chip Type Warm White LED Model: NS*6*L*083*BT*", Nichia Specification No. STS-DA1-0181C. In these devices, alternating layers of aluminum and tungsten are provided directly on the sapphire substrate, followed by a layer of platinum and a layer of gold-tin.

SUMMARY OF THE INVENTION

Light emitting diodes according to various embodiments include a silicon carbide substrate having first and second opposing faces, a diode region on the first face, anode and cathode contacts on the diode region opposite the silicon carbide substrate, and a hybrid reflector on the silicon carbide substrate opposite the diode region. The hybrid reflector comprises a transparent layer having an index of refraction that is lower than the silicon carbide substrate (for example, an index of refraction of about 1.5 compared to an index of refraction of about 2.75 for the silicon carbide substrate), and a reflective layer on the transparent layer, opposite the substrate. In other embodiments, a die attach layer may be provided on the hybrid reflector, opposite the silicon carbide substrate. In yet other embodiments, a barrier layer may be provided between the hybrid reflector and the die attach layer. In some embodiments, the transparent layer comprises silicon dioxide, the reflective layer comprises aluminum, the die attach layer comprises gold-tin alloy, and the barrier layer comprises platinum. Moreover, in some embodiments, the transparent layer, the reflective layer, the die attach layer and the barrier layer are all thin film layers on the silicon carbide substrate, to provide an integrated backside reflector and die attach for the light emitting diode.

Viewed from a materials standpoint, light emitting diodes according to various embodiments include a silicon carbide substrate having first and second opposing faces, a diode region on the first face and including therein an n-type layer and a p-type layer, an anode contact that ohmically contacts the p-type layer and extends on the diode region opposite the silicon carbide substrate, and a cathode contact that ohmically contacts the n-type layer and also extends on the diode region opposite the silicon carbide substrate. A layer comprising silicon dioxide is provided on the second face of the silicon carbide substrate, and a layer comprising aluminum is provided on the layer comprising silicon dioxide, opposite the silicon carbide substrate. In other embodiments, a layer comprising gold is provided on the layer comprising aluminum, opposite the layer comprising silicon dioxide.

In some embodiments, the layer comprising gold comprises gold-tin alloy. In other embodiments, the layer comprising gold includes a first layer comprising gold-tin alloy on the layer comprising aluminum, opposite the layer comprising silicon carbide, and a second layer comprising elemental gold on the first layer comprising gold-tin alloy, opposite the layer comprising aluminum. Moreover, still other embodiments include a layer comprising platinum between the layer comprising aluminum and the layer comprising gold. Still other embodiments include a layer comprising titanium between the layer comprising platinum and the layer comprising aluminum, and a layer comprising nickel between the layer comprising platinum and the layer comprising gold. In any of these embodiments, these layers may be thin film layers on the silicon carbide substrate, to provide an integrated backside reflector and die attach for the light emitting diode.

Yet other embodiments provide an integrated backside reflector and die attach for a light emitting diode. The integrated backside reflector and die attach includes a hybrid reflector on a silicon carbide substrate opposite a diode region. The hybrid reflector comprises a transparent layer having an index of refraction that is lower than the silicon carbide substrate, and a reflective layer comprising metal on the transparent layer opposite the substrate. A die attach layer comprising metal is provided on the reflective layer opposite the transparent layer. In other embodiments, a barrier layer may be provided between the hybrid reflector and the die attach layer. The materials for these layers may be as described above, and these layers may all be thin film layers on the silicon carbide substrate.

Various embodiments described herein may be particularly effective for enhancing the optical performance of gallium nitride-based light emitting diodes on a silicon carbide substrate, because the index of refraction of silicon carbide (about 2.75) is higher than that of gallium nitride (about 2.5), so that much of the light emitted by the gallium nitride diode region enters the silicon carbide substrate. This contrasts sharply with a gallium nitride diode region on a sapphire substrate, wherein the index of refraction of sapphire (about 1.8) is lower than the gallium nitride (about 2.5), so that less light naturally enters the sapphire substrate to begin with. Accordingly, embodiments of the invention may be used with other substrates, such as a gallium nitride substrate, wherein the diode region has an index of refraction that is not higher than the substrate, i.e., the diode region has an index of refraction that is equal to or less than that of the substrate. Accordingly, various embodiments described herein may be used with light emitting diodes that include a gallium nitride diode region on a gallium nitride substrate in addition to those embodiments that include a gallium nitride diode region on a silicon carbide substrate.

Moreover, when a silicon carbide or gallium nitride substrate is used, a silicon dioxide transparent layer can be highly effective in reflecting almost all of the light from the silicon carbide or gallium nitride substrate, due to the large index difference between the silicon dioxide transparent layer (index of refraction of about 1.5) compared to silicon carbide (index of refraction of about 2.75) or gallium nitride (index of refraction of about 2.5). Thus, in these embodiments, a hybrid reflector that includes a transparent layer and a reflective layer may not need to be used. Rather, a transparent layer having an index of refraction that is lower than the substrate, such as a transparent layer comprising silicon dioxide, may be used, and a die attach layer may be provided directly on the transparent layer. In these embodiments, since a reflective layer such as aluminum need not be used, there may be little or no need to provide barrier layers as well. A simplified structure thereby may be provided.

DETAILED DESCRIPTION

Figure 1:
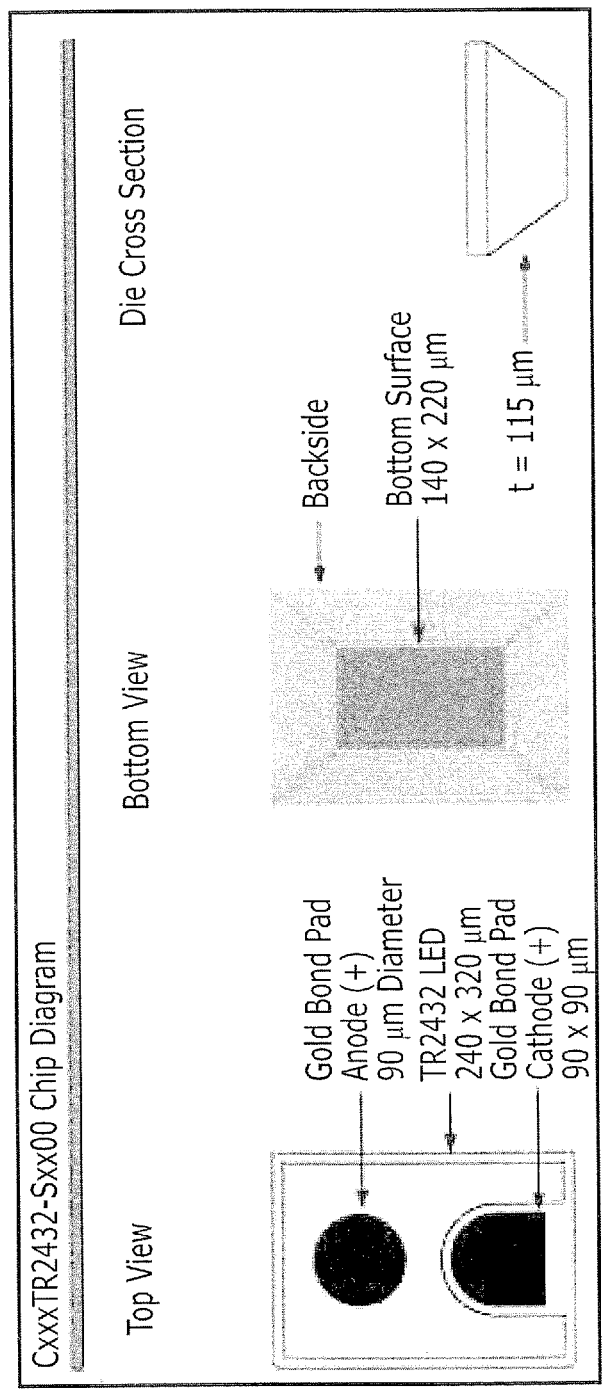
FIG. 1 is a reproduction of a Chip Diagram from a Data Sheet of a commercially-available light emitting diode.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

It will be understood that when an element such as a layer, region or substrate is referred to as being "on" another element, it can be directly on the other element or intervening elements may also be present. Furthermore, relative terms such as "beneath", "overlies", "topside" and "backside" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

As used herein, a layer or region of an LED is considered to be "transparent" when at least 80%, and in some embodiments at least 90%, of the radiation from the LED that impinges on the transparent layer or region is not absorbed by or reflected from the transparent region. For example, in the context of blue and/or green LEDs that are fabricated from gallium nitride-based materials, silicon dioxide can provide a transparent insulating layer (for example, at least 90% transparent), indium tin oxide (ITO) can provide a transparent conductive layer (for example, at least 90% transparent) as measured by considering transmitted and reflected components on a sapphire substrate, and silicon carbide can provide a transparent substrate. Moreover, as used herein, a layer or region of an LED is considered to be "reflective" when at least 80%, and in some embodiments at least 90%, of the angle averaged radiation that impinges on the reflective layer or region from the LED is reflected back into the LED, away from the layer or region. For example, in the context of gallium nitride-based blue and/or green LEDs, aluminum (for example, at least 90% reflective) may be considered a reflective material. In the case of ultraviolet (UV) LEDs, appropriate materials may be selected to provide a desired, and in some embodiments high, reflectivity and/or a desired, and in some embodiments low, absorption.

Some embodiments now will be described generally with reference to gallium nitride (GaN)-based light emitting diodes on silicon carbide-based substrates. However, it will be understood by those having skill in the art that other embodiments of the present invention may be based on a variety of different diode regions on silicon carbide-based substrates. In some embodiments, the light emitting diodes may be gallium nitride-based LED devices marketed by Cree, Inc. of Durham, N.C., such as the above-described ETC family of LEDs.

Figure 2:
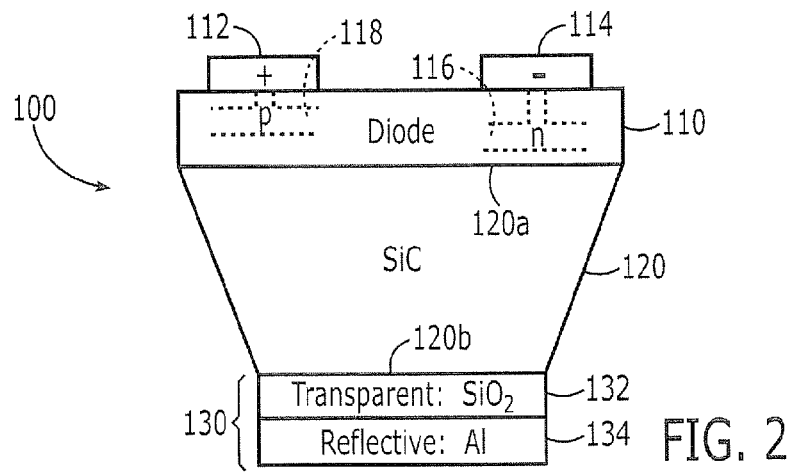
FIGS. 2-7 are cross-sectional views of light emitting diodes according to various embodiments.

FIG. 2 is a cross-sectional view of a light emitting diode according to various embodiments. Referring to FIG. 2, these light emitting diodes 100 include a diode region 110 that is on a first face 120a of a silicon carbide (SiC) substrate 120. The diode region 110 includes therein an n-type layer 116 and a p-type layer 118. Other layers or regions may be provided, which may include quantum wells, buffer layers, etc., that need not be described herein. The diode region 110 may also be referred to as an "LED epi region" because is typically formed epitaxially on the first face 120a of the silicon carbide substrate 120. For example, a Group III-nitride-based LED epi 110 may be formed on a silicon carbide growth substrate 120.

Continuing with the description of FIG. 2, an anode contact 112, also referred to as a "p-contact", ohmically contacts the p-type layer 118 and extends on the diode region 110 opposite the silicon carbide substrate 120. The anode contact 112 may extend to a greater or lesser extent on the diode region 110 than illustrated in FIG. 2. A cathode contact 114, also referred to as an "n-contact", electrically contacts the n-type layer 116 and also extends on the diode region 110 opposite the silicon carbide substrate 120. The cathode contact 114 also may extend to a greater or lesser extent on the diode region 110 than illustrated in FIG. 2. Thus, topside anode and cathode contacts are provided. It will be understood that the anode and cathode contacts 112, 114, respectively, may directly and ohmically contact the p-type layer 118 and the n-type layer 116, respectively, or these contacts may include one or more intermediate layers that provide the actual ohmic contact.

The silicon carbide substrate 120 may be transparent to optical radiation that is emitted by the diode region 110, and may include oblique sidewalls, such that the second face 120b has an area less than, and for some embodiments about 38% of, that of the first face 120a. One technique for fabricating a silicon carbide substrate that is transparent to optical radiation that is emitted by the diode region is described in U.S. Pat. No. 5,718,760, the disclosure of which is hereby incorporated herein by reference in its entirety as if set forth fully herein. The silicon carbide substrate 120 may comprise 2H, 4H, 6H, 8H, 15R and/or 3C polytypes. The 6H and/or 4H polytypes may be used in various optoelectronic applications. In other embodiments, the silicon carbide substrate 120 is a compensated, colorless silicon carbide substrate.

As described in U.S. Pat. No. 5,718,760, colorless silicon carbide may be fabricated by sublimation of silicon carbide in the presence of compensating amounts of p-type and n-type dopants. Naturally-occurring silicon carbide typically is black, due to high impurity levels. Conventional microelectronic silicon carbide wafers have a translucent blue, amber or green hue depending upon the controlled doping level in the crystal. As described in U.S. Pat. No. 5,718,760, it was found that by carefully controlling the doping of silicon carbide crystals with compensating levels of n-type and p-type dopants at low doping concentrations, colorless single crystals of silicon carbide may be obtained. In other embodiments, undoped silicon carbide may be used.

In accordance with some embodiments, colorless boules of silicon carbide grown, for example, according to processes described in U.S. Pat. No. 5,718,760 and references cited therein, may be cut into wafers for processing. Gallium nitride-based epitaxial layers may be formed on the wafers, for example, as described in U.S. Pat. No. 6,177,688, which then can be processed to produce structures such as are shown in FIG. 2.

Continuing with the description of FIG. 2, a hybrid reflector 130 is provided on the silicon carbide substrate 120 opposite the diode region 110. The hybrid reflector comprises a transparent layer 132 having an index of refraction that is lower than the silicon carbide substrate 120 and a reflective layer 134 comprising metal on the transparent layer 132 opposite the substrate 120. The transparent layer 132 and the reflective layer 134 may both be thin film layers on the silicon carbide substrate 120, to provide an integrated backside reflector 130 for the light emitting diode 100.

In some embodiments, the transparent layer 132 comprises silicon dioxide ($SiO_2$) that has an index of refraction of about 1.5, which is much lower than that of silicon carbide (index of refraction of about 2.75). Moreover, the reflective layer 134 may comprise aluminum (Al) and/or silver (Ag). In other embodiments, the transparent layer 132 may comprise a distributed Bragg reflector, comprising, for example, alternating layers of silicon dioxide and titanium dioxide ($TiO_2$). The transparent layer 132 and the reflective layer 134 can provide a hybrid reflector or hybrid mirror 130, wherein the underlying transparent layer 132 provides an index of refraction mismatch or index step to enhance the total internal reflection (TIR) of the substrate 120 compared to absence of the transparent layer 132. Additional detailed discussion will be provided below.

Figure 3:
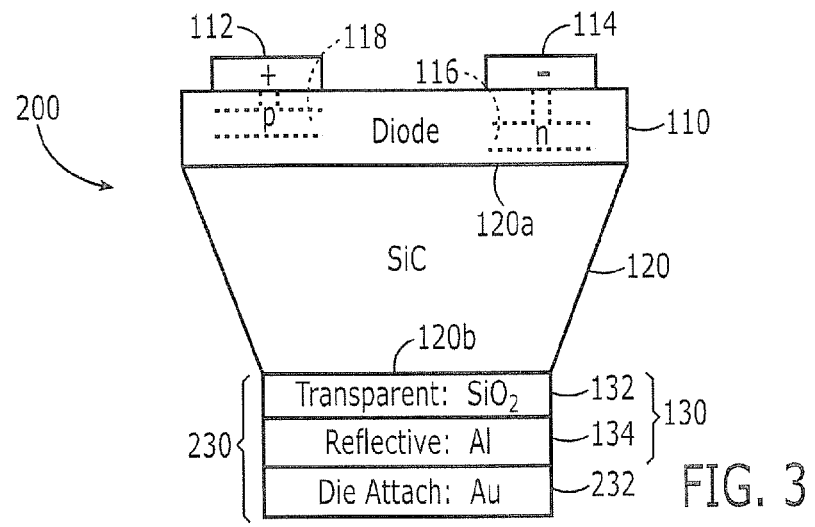

FIG. 3 illustrates LEDs according to yet other embodiments. These LEDs 200 may also include a die attach layer 132 that comprises metal, such as gold, on the reflective layer 134 opposite the transparent layer 132. The hybrid reflector 130 and the die attach layer 232 may all comprise thin film layers, so as to provide an integrated backside reflector and die attach 230 for the light emitting diode 200.

Figure 4:
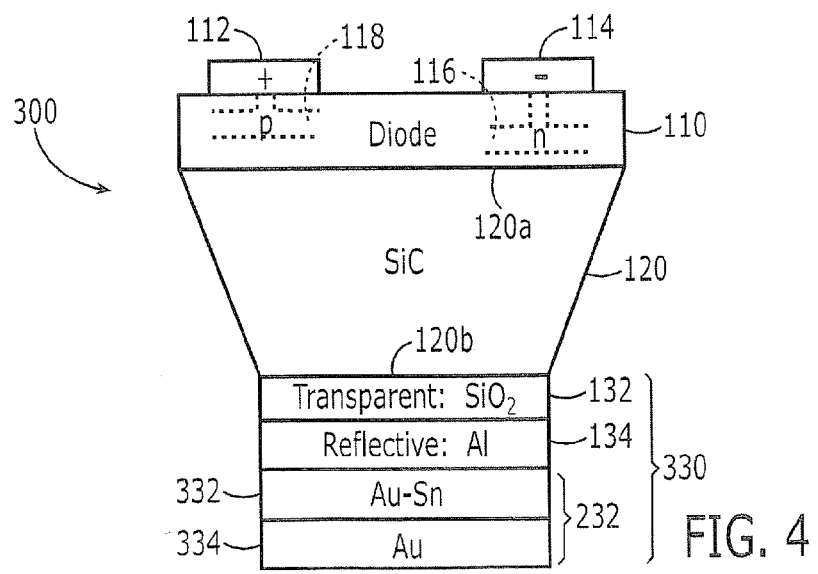

FIG. 4 illustrates LEDs according to yet other embodiments. In these LEDs, the die attach layer 232 may comprise a multilayer structure including a first layer comprising gold-tin (Au—Sn) alloy on the reflective layer 134 opposite the transparent layer 132, and a second layer 334 comprising elemental gold, on the first layer 332 comprising gold-tin alloy, opposite the layer comprising aluminum 134. In some embodiments, the gold-tin layer 332 may be a eutectic 80-20 gold-tin layer, so as to provide a relatively low melting point die attach. The gold layer 334 may provide an antioxidizing cap for the gold-tin layer 332, and may be absorbed within the gold-tin layer 332 upon reflow, as will be described in connection with FIG. 7. In other embodiments, however, the gold cap 334 may not be used. The layers 132, 134, 332 and 334 may all be thin film layers to provide an integrated backside reflector and die attach 330 for the LED 300.

Figure 5:
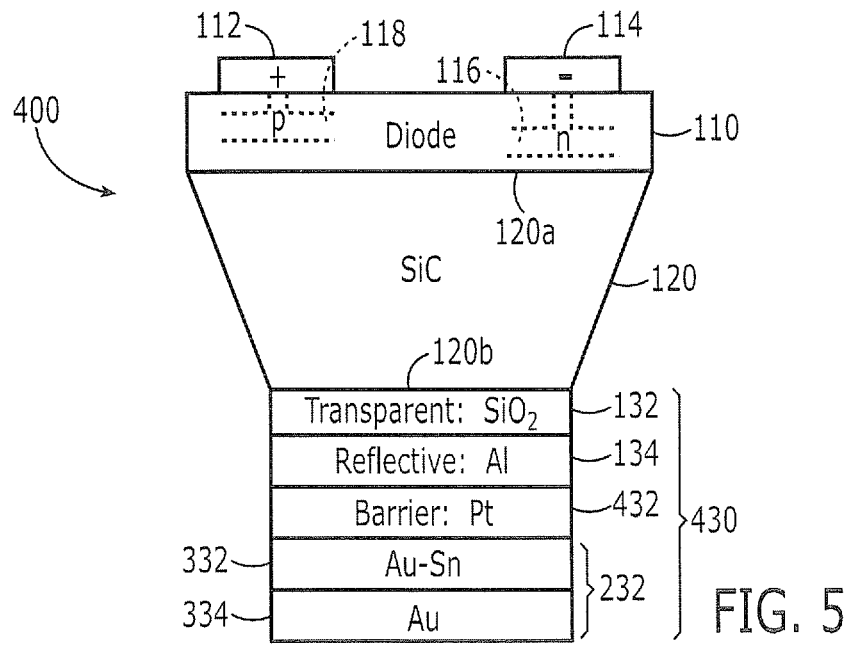

FIG. 5 illustrates yet other embodiments. In these LEDs 400, a barrier layer 432 comprising, for example, platinum (Pt), is provided between the reflective layer 134 and the gold-tin layer 332. The barrier layer 432 can reduce or eliminate interaction between the tin in layer 332 and the aluminum in layer 134, as will be described in more detail below. The layers 132, 134, 432, 332 and 334 may all be provided as thin films on the silicon carbide substrate 120, so as to provide an integrated backside reflector and die attach 430 for the light emitting diode 400.

Figure 6:
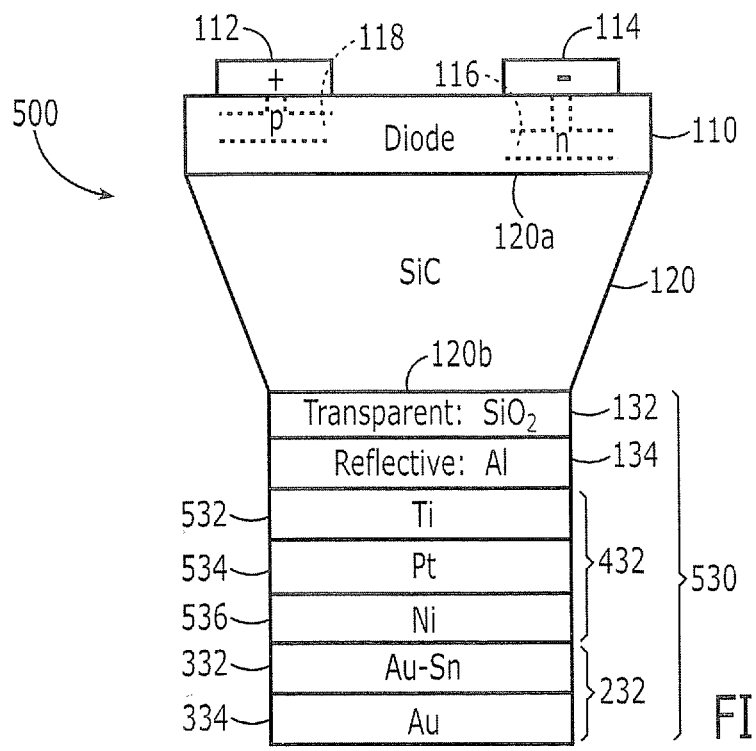

FIG. 6 illustrates still other embodiments. In these light emitting diodes 500, the barrier layer 432 may comprise a plurality of layers including a layer comprising platinum 434, a layer comprising titanium (Ti) 432 and a layer comprising nickel (Ni) 536. The titanium layer 532 may provide an adhesive layer for the platinum layer 534. The layer comprising nickel 536 may provide an additional barrier layer, such that the layer comprising platinum 534 and the layer comprising nickel 536 provide a multilayer barrier structure. The layers 132, 134, 532, 534, 536, 332 and 334 may all be thin film layers on the silicon carbide substrate 110 to provide an integrated backside reflector and die attach 530 for the light emitting diode 500.

Figure 7:
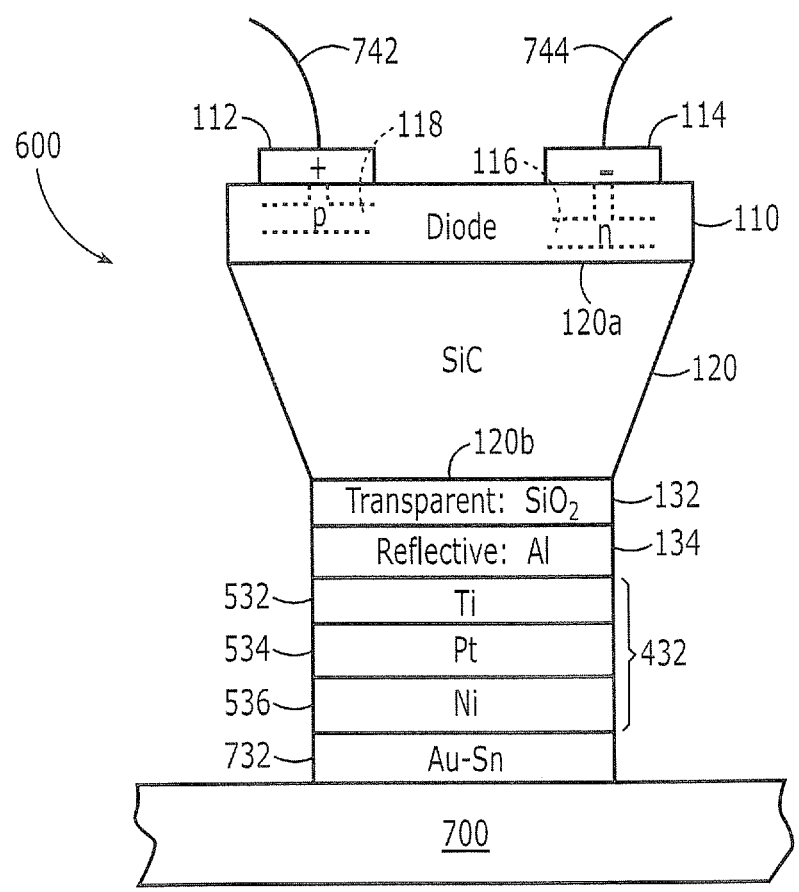

FIG. 7 is a cross-sectional view of an LED of FIG. 6 mounted on a mounting substrate 700. The mounting substrate 700 may be a printed circuit board, metal-clad printed circuit board, solid metal block, ceramic substrate, header, backlight unit, light fixture and/or any other conventional mounting substrate for an LED. The LED 600 may be attached to the mounting substrate 700 by heating above the reflow temperature of the eutectic gold-tin layer 332 of FIG. 6, while contacting the LED 600 to a pad, trace or other mounting feature on the mounting substrate 700. During reflow, the gold cap 334 may be absorbed into the gold-tin layer 332, so that a gold-tin layer 732 of FIG. 7 has a higher percentage of gold than the gold-tin layer 332 of FIG. 6, and directly contacts the mounting substrate 700 of FIG. 7. During reflow, the barrier layer(s) 534/536 can reduce or prevent interaction between the tin in the gold-tin layer 332 and the aluminum in the reflective layer 134, that may otherwise occur at temperatures above the 290° C. reflow temperature of eutectic gold-tin, for example at die attach temperatures of 300° C. and above.

Other die attach techniques, such as brazing, may also be used in other embodiments. Moreover, other materials, such as epoxy or other silicone-based materials, may be used for die attach in other embodiments.

Wire bonds 742 and 744 may be provided to connect the anode and cathode contacts 112 and 114, respectively, to external circuitry, such as driving circuitry for the LED 600. Conventional wire bonding techniques may be used. It will also be understood that any of the other embodiments of FIGS. 2-5 may be mounted on a mounting substrate as illustrated in FIG. 7.

Additional discussion of various embodiments will now be provided. In particular, various embodiments described herein may provide an integrated backside reflector and die attach for a silicon carbide-based LED that can enable higher drive power and/or higher light output as compared to an unmetallized die, by allowing reduced thermal resistance and increased active emission area. Improved reliability also may be provided due to increased die shear strength and correspondingly increased ball shear strength compared to a conventional silicone or epoxy die attach that is used for an unmetallized die. For example, up to 10 times stronger die attach may be provided by backside metallization according to various embodiments described herein, compared to a conventional silicon carbide-to-epoxy mounting, due to the metal-to-metal bonding in a die attach as described herein. Moreover, thermal resistance may decrease by, for example, a factor of 2, due to the backside metallization. The backside metallization may also increase the thickness of the LED somewhat compared to an unmetallized backside.

Figure 8A:
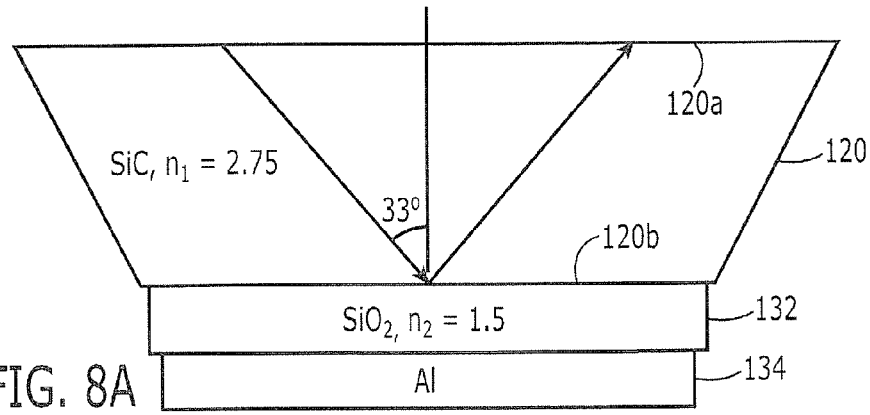
FIG. 8A is a cross-sectional view of a portion of a light emitting diode according to various embodiments, illustrating optical operation of a hybrid reflector.

The use of a transparent layer comprising silicon dioxide 132 and a reflective metal layer 134 as a hybrid reflector 130, according to various embodiments, will now be described. In particular, FIG. 8A is a partial cross-section of an LED according to various embodiments, illustrating the silicon carbide substrate 120, the transparent silicon dioxide layer 132 and the reflective layer comprising aluminum 134. As shown, the high index of refraction of silicon carbide (index of refraction n of about 2.75) relative to the low index of refraction of silicon dioxide (index of refraction n of about 1.5) increases the reflectivity. More specifically, light outside of the critical angle of about 33° (that is, at larger angles) will be reflected without interacting with the lossy aluminum 134 due to the high index contrast.

Figure 8B:
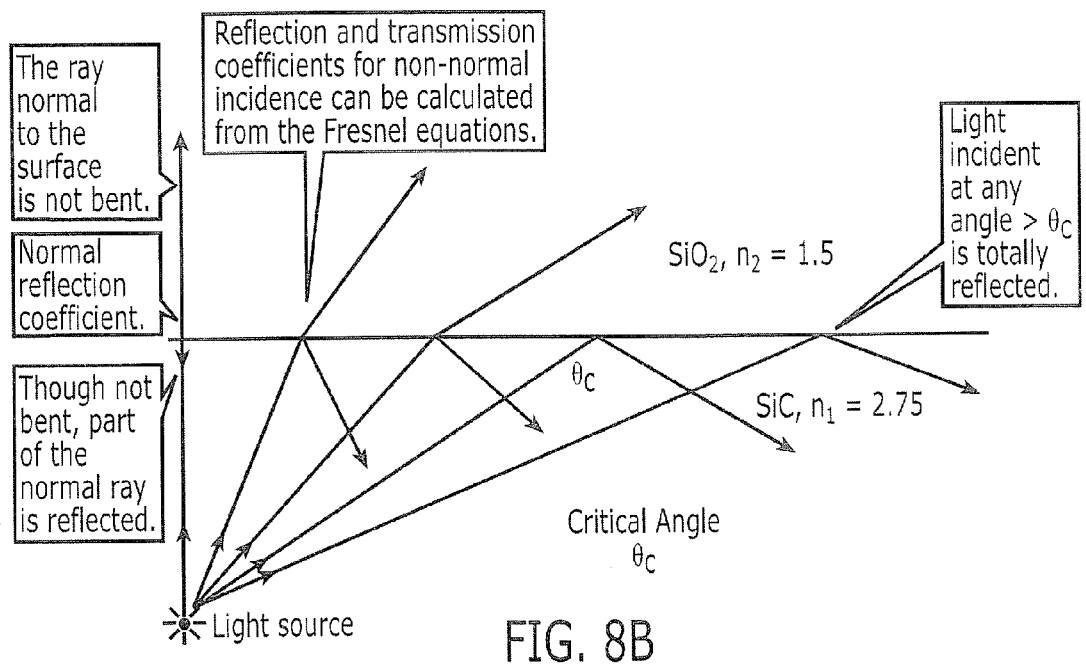
FIG. 8B graphically illustrates reflection and transmission of light in a light emitting diode of FIG. 8A at various angles of incidence.

FIG. 8B graphically illustrates this reflection and transmission for light at various angles above and below the critical angle $\theta_c$. As shown, light incident at any angle greater than the critical angle is totally reflected, whereas light striking the interface at less than the critical angle will be at least partially reflected and at least partially transmitted. This transmitted light will then be reflected by the aluminum layer 134.

In fact, according to various embodiments, the index of refraction difference between silicon carbide (index of refraction of about 2.75) and silicon dioxide (index of refraction of about 1.5) is so great that the transparent layer comprising silicon dioxide 132 can reflect almost all of the light that emerges from the backside 120b of the silicon carbide substrate 120, and can therefore reduce or eliminate the need for a reflective layer 134 or a hybrid reflector. By eliminating the need for a reflective layer 134, such as aluminum, the die attach layer 232 can be provided directly on the transparent layer 132. Moreover, by eliminating the need to use aluminum, one or more barrier layers 432 also need not be used.

Figure 9:
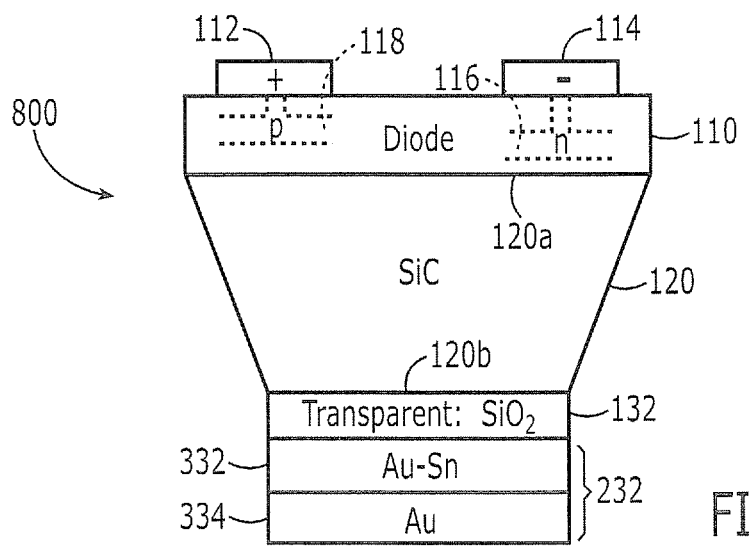
FIGS. 9 and 10 are cross-sectional views of light emitting diodes according to various other embodiments.

FIG. 9 illustrates light emitting diodes according to these embodiments. Referring now to FIG. 9, these LEDs 800 may correspond to the LEDs 300 of FIG. 4, except that a reflective layer 134, comprising for example aluminum, need not be used. Thus, the reflector can consist of the transparent layer 132, and the die attach 232 may be provided directly on the transparent layer 132. In other embodiments, the transparent layer 132 may be embodied by a distributed Bragg reflector. By eliminating the reflective layer 134 of FIG. 4, the need for one or more barrier layers as shown by FIGS. 5-7 may also be reduced or eliminated. Thus, a simplified structure with fewer processing steps may be obtained. Moreover, due to the high index mismatch between the silicon carbide substrate 120 (index of refraction of about 2.75) and the transparent layer comprising silicon dioxide 132 (index of refraction of about 1.5), the transparent layer 132 can reflect almost all the radiation back into the silicon carbide substrate 120. Accordingly, the simplified structure of FIG. 9 may still provide sufficient optical performance.

It will be understood that various embodiments have been described herein that use a silicon carbide substrate 120, since the silicon carbide substrate 120 has an index of refraction (about 2.75) that is much higher than the gallium nitride-based diode region 110 (index of refraction of about 2.5). Accordingly, a reflective backside may be highly desirable and highly effective for silicon carbide substrates. This contrasts sharply with conventional gallium nitride-on-sapphire LEDs, wherein the sapphire substrate has an index of refraction (about 1.8) that is lower than that of gallium nitride (about 2.5). In these LEDs, less light enters the sapphire substrate to begin with, so that there is less need for a low refractive index layer. In fact, as was described above, some gallium nitride-on-sapphire LEDs do not even include a transparent layer on their backside.

Figure 10:
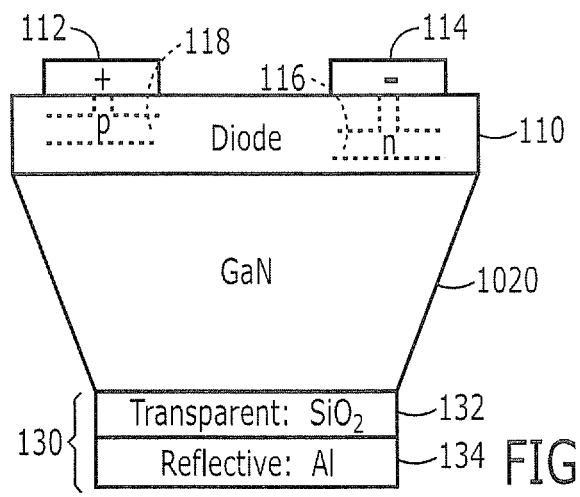

Accordingly, various embodiments of the invention may be used in other LEDs where the index of refraction of the diode region is not higher than the substrate. Stated otherwise, the index of refraction of the substrate is equal to or greater than that of the diode region. Thus, for example, any and all of the embodiments described herein may also be used with gallium nitride diode regions on a gallium nitride-based substrate. FIG. 10 illustrates some of these embodiments, in a configuration analogous to FIG. 2, wherein the substrate 1020 comprises gallium nitride rather than silicon carbide. Other embodiments may use the gallium nitride-based substrate 1020 instead of the silicon carbide substrate 120 in any or all of FIGS. 3-9.

Even more generally, any substrate that has an index of refraction that is equal to or greater than that of the diode region may be used. In some embodiments, index of refraction of the substrate may be greater than about 2 and, in other embodiments, may be greater than about 2.3. For example, gallium nitride-based materials may have an index of refraction in the range of about 2.5 to about 2.7. In other embodiments, the substrate may have an index of refraction that is close to that of the diode material, so as to provide little index change at the interface.

The substrate may also be thermally and/or electrically conductive. Thus, as described above, silicon carbide, gallium nitride and other gallium nitride-based materials, such as aluminum gallium nitride and/or aluminum indium gallium nitride, may be used. Other non-gallium nitride-based materials, such as diamond, also may be used.

Moreover, in some embodiments, the substrate may be shaped into a beveled, ATON or other shape and/or textured to provide relatively small surface features, so that the light can readily escape from the substrate. Various embodiments described herein may be particularly useful with shaped substrates, where it may be particularly desirable to have an appropriate integrated die attach. In particular, since there may be potentially less surface area to die attach to begin with, die attachment may be more difficult than with non-shaped substrates. Various embodiments described herein may facilitate die attach to shaped substrates.

Integrated die attach structures according to various embodiments described herein may also make it easier on the LED packager. In particular, the packager may not adversely impact the performance of the backside reflector, since it is already covered with a die attach material.

The following Table provides illustrative minimum, maximum and nominal thicknesses for the various layers described herein. It will be understood that these values are all illustrative and approximate and that these values may vary in absolute terms and/or relative to one another in various other embodiments.

TABLE

| Layer | Minimum | Maximum | Nominal |
|---|---|---|---|
| SiC 120 | 50 µm | 400 µm | 155 µm |
| Transparent Layer, SiO$_2$ 132 | 100 Å | 10,000 Å | 5,000 Å |
| Reflective Layer, Al 134 | 250 Å | 3,000 Å | 1,500 Å |
| Titanium Layer 532 | 50 Å | 2,000 Å | 200 Å |
| Platinum Layer 534 | 250 Å | 7,500 Å | 2,500 Å |
| Nickel Layer 536 | 250 Å | 10,000 Å | 3,000 Å |
| Gold-Tin Layer 332 | 500 Å | 50,000 Å | 30,000 Å |
| Gold Layer 334 | 200 Å | 10,000 Å | 4,000 Å |

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A light emitting diode comprising:
    a silicon carbide substrate having first and second opposing faces and oblique sidewalls therebetween;
    a diode region on the first face and including therein an n-type layer and a p-type layer;
    an anode contact that ohmically contacts the p-type layer and extends on the diode region opposite the silicon carbide substrate;
    a cathode contact that ohmically contacts the n-type layer and also extends on the diode region opposite the silicon carbide substrate;
    a layer comprising silicon dioxide on the second face of the silicon carbide substrate; and
    a layer comprising aluminum on the layer comprising silicon dioxide, opposite the silicon carbide substrate;

wherein the layer comprising silicon dioxide and the layer comprising aluminum do not extend onto the oblique sidewalls of the silicon carbide substrate.

2. A light emitting diode according to claim 1 further comprising:
a layer comprising gold on the layer comprising aluminum, opposite the layer comprising silicon dioxide, wherein the layer comprising gold does not extend onto the oblique sidewalls of the silicon carbide substrate.

3. A light emitting diode according to claim 2 wherein the layer comprising gold comprises:
a first layer comprising gold-tin alloy on the layer comprising aluminum, opposite the layer comprising silicon dioxide; and
a second layer comprising elemental gold on the first layer comprising gold-tin alloy, opposite the layer comprising aluminum.

4. A light emitting diode according to claim 2 wherein the layer comprising gold comprises a layer comprising gold-tin alloy.

5. A light emitting diode according to claim 2 further comprising:
a layer comprising platinum between the layer comprising aluminum and the layer comprising gold,
wherein the layer comprising platinum does not extend onto the oblique sidewalls of the silicon carbide substrate.

6. A light emitting diode according to claim 5 further comprising:
a layer comprising titanium between the layer comprising platinum and the layer comprising aluminum; and
a layer comprising nickel between the layer comprising platinum and the layer comprising gold,
wherein the layer comprising titanium and the layer comprising nickel do not extend onto the oblique sidewalls of the silicon carbide substrate.

7. A light emitting diode according to claim 6 wherein the layers comprising silicon dioxide, aluminum, gold, platinum, titanium and nickel are all thin film layers on the silicon carbide substrate to provide an integrated backside reflector and die attach for the light emitting diode.

8. A light emitting diode according to claim 2 wherein the layers comprising silicon dioxide, aluminum and gold are all thin film layers on the silicon carbide substrate to provide an integrated backside reflector and die attach for the light emitting diode.

9. A light emitting diode comprising:
a silicon carbide substrate having first and second opposing faces and oblique sidewalls therebetween;
a diode region on the first face;
anode and cathode contacts on the diode region opposite the silicon carbide substrate;
a hybrid reflector on the silicon carbide substrate opposite the diode region, the hybrid reflector comprising a transparent layer having an index of refraction that is lower than the silicon carbide substrate and a reflective layer on the transparent layer, opposite the substrate, wherein the transparent layer comprises silicon dioxide;
wherein the hybrid reflector does not extend onto the oblique sidewalls of the silicon carbide substrate.

10. A light emitting diode according to claim 9 further comprising:
a die attach layer on the hybrid reflector, opposite the silicon carbide substrate, wherein the die attach layer does not extend onto the oblique sidewalls of the silicon carbide substrate.

11. A light emitting diode according to claim 10 further comprising a barrier layer between the hybrid reflector and the die attach layer, wherein the barrier layer does not extend onto the oblique sidewalls of the silicon carbide substrate.

12. A light emitting diode according to claim 11 wherein the reflective layer comprises aluminum, the die attach layer comprises gold-tin alloy and the barrier layer comprises platinum.

13. A light emitting diode according to claim 11 wherein the transparent layer, the reflective layer, the die attach layer and the barrier layer are all thin film layers on the silicon carbide substrate to provide an integrated backside reflector and die attach for the light emitting diode.

14. A light emitting diode according to claim 9 wherein the silicon carbide substrate has an index of refraction of about 2.75 and the transparent layer has an index of refraction of about 1.5.

15. An integrated backside reflector and die attach for a light emitting diode that includes a silicon carbide substrate having first and second opposing faces and oblique sidewalls therebetween, a diode region on the first face and anode and cathode contacts on the diode region opposite the silicon carbide substrate; the integrated backside reflector and die attach comprising:
a hybrid reflector on the silicon carbide substrate opposite the diode region, the hybrid reflector comprising a transparent layer having an index of refraction that is lower than the silicon carbide substrate and a reflective layer comprising metal on the transparent layer, opposite the substrate, wherein the transparent layer comprises silicon dioxide;
a die attach layer comprising metal on the reflective layer, opposite the transparent layer; and
a barrier layer between the hybrid reflector and the die attach layer,
wherein the hybrid reflector, the die attach layer and the barrier layer do not extend onto the oblique sidewalls of the silicon carbide substrate.

16. An integrated backside reflector and die attach for a light emitting diode according to claim 15 wherein the reflective layer reflective layer comprises aluminum, the die attach layer comprises gold-tin alloy and the barrier layer comprises platinum.

17. An integrated backside reflector and die attach for a light emitting diode according to claim 15 wherein the transparent layer, the reflective layer, the die attach layer and the barrier layer are all thin film layers on the silicon carbide substrate.

18. An integrated backside reflector and die attach for a light emitting diode that includes a silicon carbide substrate having first and second opposing faces and oblique sidewalls therebetween, a diode region on the first face and anode and cathode contacts on the diode region opposite the silicon carbide substrate; the integrated backside reflector and die attach comprising:
a hybrid reflector on the silicon carbide substrate opposite the diode region, the hybrid reflector comprising a transparent layer having an index of refraction that is lower than the silicon carbide substrate and a reflective layer comprising metal on the transparent layer, opposite the substrate, wherein the transparent layer comprises silicon dioxide; and
a die attach layer comprising metal on the reflective layer, opposite the transparent layer;
wherein the transparent layer, the reflective layer and the die attach layer are all thin film layers on the silicon carbide substrate that do not extend onto the oblique sidewalls of the silicon carbide substrate.

19. An integrated backside reflector and die attach for a light emitting diode according to claim 18 wherein the silicon carbide substrate has an index of refraction of about 2.75 and the transparent layer has an index of refraction of about 1.5.

20. A light emitting diode comprising:
a substrate having first and second opposing faces and oblique sidewalls therebetween;
a diode region on the first face, the diode region having an index of refraction that is not higher than the substrate;
anode and cathode contacts on the diode region opposite the substrate;
a transparent layer having an index of refraction that is lower than the substrate, on the substrate opposite the diode region, wherein the transparent layer comprises silicon dioxide;
a reflective layer on the transparent layer, opposite the substrate; and
a die attach layer on the reflective layer, opposite the transparent layer,
wherein the transparent layer, the reflective layer and the die attach layer do not extend onto the oblique sidewalls of the substrate.

21. A light emitting diode according to claim 20 further comprising a barrier layer between the reflective layer and the die attach layer, wherein the barrier layer does not extend onto the oblique sidewalls of the substrate.

22. A light emitting diode according to claim 20 wherein the substrate comprises silicon carbide and the diode region comprises gallium nitride.

23. A light emitting diode according to claim 20 wherein the substrate comprises gallium nitride and the diode region comprises gallium nitride.

* * * * *

UNITED STATES PATENT AND TRADEMARK OFFICE
CERTIFICATE OF CORRECTION

PATENT NO. : 9,437,785 B2  
APPLICATION NO. : 12/538602  
DATED : September 6, 2016  
INVENTOR(S) : Bergmann et al.

Page 1 of 1

It is certified that error appears in the above-identified patent and that said Letters Patent is hereby corrected as shown below:

In the Claims  
Column 12, Claim 16, Line 42:  
Please correct "reflective layer reflective layer comprises"  
to read -- reflective layer comprises --

Signed and Sealed this  
Eighteenth Day of April, 2017

Michelle K. Lee  
*Director of the United States Patent and Trademark Office*